United States Patent [19]

Mantei

[11] Patent Number: 4,483,737
[45] Date of Patent: Nov. 20, 1984

[54] METHOD AND APPARATUS FOR PLASMA ETCHING A SUBSTRATE

[75] Inventor: Thomas D. Mantei, Cincinnati, Ohio

[73] Assignee: University of Cincinnati, Cincinnati, Ohio

[21] Appl. No.: 462,200

[22] Filed: Jan. 31, 1983

[51] Int. Cl.³ .................... H01L 21/306; B44C 1/22; C03C 15/00; C03C 25/06

[52] U.S. Cl. .................................. 156/643; 156/345; 156/646; 204/192 E; 204/298

[58] Field of Search ............... 156/345, 643, 646, 626, 156/627; 204/164, 192 E, 298

[56] References Cited

U.S. PATENT DOCUMENTS 4,361,472 11/1982 Morrison ..................... 204/192 E Primary Examiner—William A. Powell
Attorney, Agent, or Firm—Wood, Herron & Evans

[57] ABSTRACT

A method and apparatus for plasma etching a substrate, such as a semiconductor wafer, utilizing a multipole surface magnetic field confining within an etching chamber an etching plasma of substantially uniform density throughout its volume. The plasma is produced and maintained by subjecting a gas such as $CF_4$ to an ionizing discharge within the chamber. Only DC power sources are used for the discharge, so that there is virtually no perturbing radio frequency interference produced. The wafer is consequently easily biased relative to the plasma for controlled fine-scale etching. Low gas pressures permitted by the surface magnetic field result in substantially anisotropic etching of the substrate by dense plasma concentrations.

35 Claims, 2 Drawing Figures

METHOD AND APPARATUS FOR PLASMA ETCHING A SUBSTRATE

FIELD OF THE INVENTION

This invention relates to the plasma etching of semiconductor chips or other substrate surfaces at controlled rates and with controlled etched profiles. More particularly, the invention relates to improved apparatus and processes therefor.

BACKGROUND OF THE INVENTION

The use of plasmas for etching substrates such as semiconductor silicon chips or wafers at controlled rates and with controlled etched profiles is well known in the art. At its simplest level, plasma etching tools basically provide for the mounting of a photoresist masked wafer between two parallel plates within an evacuated chamber. A gas such as $CF_4$ is introduced to the chamber and the plates are oppositely driven by a radio frequency power source at a power level of 10 to 10,000 watts, creating an electronic discharge therebetween. This ionizes the gas into a highly corrosive plasma which etches the wafer through the interstices of the mask, to produce the etched design and profile desired.

This process of plasma etching semiconductor chips has several disadvantages. First, it is necessary to utilize a significant amount of energy to convert the confined gas into a plasma. The radio frequency voltage also produces a voltage bias at the wafer surface. This bias can be advantageous, but it is generally difficult to control or regulate, thus resulting in inefficient use of the plasma for etching and a lack of desirable control in directing the plasma during the etching process. The high power radio frequency supplies are also relatively expensive, compared to comparable DC power supplies.

A further significant problem in the foregoing process is the non-uniformity of density of the plasma near the wafer. These types of processes generally rely upon high discharge energies and the constant throughput of gas to maintain an appropriately dense plasma surrounding the substrate.

Attempts have been made to overcome these problems. For example, one known hot filament plasma etching technique utilizes a volume magnetic field to control the plasma within an etching chamber. This system generally includes an evacuated chamber having a filament electrode and a spaced anode plate located within the chamber. The filament is heated by electric current from a power supply so as to emit or "boil off" electrons, thereby creating an electrical discharge between the filament and the opposed anode. The anode itself may be separately biased to control the potential of the plasma relative to ground. Partial control of the plasma thus created is accomplished by use of a volume magnetic field produced by electrical current flowing through magnet coils located above and below the etching chamber.

While this device does control the plasma in the chamber to a certain extent, the use of such electromagnets produces a volume magnetic field where magnetic field lines of varying strength extend throughout the entire plasma volume. Accordingly, there is no overall uniformity of plasma density. Instead, plasma is concentrated consistent with the field lines. Less uniformity and undesirable variations in the etching profiles can result. Moreover, since a volume magnetic field is produced, both ions and primary or ionizing electrons will constantly migrate out of the region surrounding the wafer. This reduces the efficiency of the system by increasing the amount of gas necessary to maintain a given plasma density and by increasing the amount of energy expended to maintain the plasma through generation of ionizing electrons to replace those escaping. Significant amounts of energy are also required to generate the electromagnetic field.

A major problem with any plasma etching system wherein plasma and ionizing electrons are lost by migration, as discussed above, is that a substantial amount of ionizing electrons and plasma must be continually produced. In particular, plasma ion loss requires more gas to be used with resulting higher gas pressures. This has the effect of not only increasing the migration of ions out of the device through collisions, but also the shortening of the mean free path of the ionizing electrons. A shorter mean free path increases the random motion of corrosive reactant ions, and produces more isotropic etching. This reduces the ability to etch the narrow profile features of the semiconductor desired.

Accordingly, it is one object of this invention to provide improved methods and apparatus for plasma etching a substrate, such as a semiconductor wafer.

Another object of the invention is to provide improved methods and apparatus for plasma etching of semiconductor chips or other substrate surfaces at controlled rates and with highly defined and controlled etch profiles.

A further object of the invention has been to provide improved methods and apparatus for plasma etching semiconductor wafers without subjecting the wafer to induced electrical bias from the use of undesirably high powered radio frequency discharge power supplies.

SUMMARY OF THE INVENTION

To these ends, a preferred embodiment of the invention contemplates subjecting a masked substrate semiconductor wafer to a highly uniform and dense plasma concentration generated within and confined by a surface magnetic field. The plasma is produced by subjecting a gas within the field to ionizing electrons from a hot filament. Utilization of such a generated and confined plasma for etching produces a number of highly advantageous results. Specifically, the plasma environment is confined with no field lines extending through the plasma and undesirably concentrating it. A highly uniform density plasma is produced, thus enhancing uniformity of the etching process.

Since the plasma is generated within a surface magnetic boundary, very little plasma and ionizing electrons escape and there is no need to constantly produce large volumes of plasma. Accordingly, less gas is required and pressure can be held to a minimum. This reduces plasma ion collisions, and increases the mean free path of the ionizing electrons, thereby promoting anisotropic etching and highly defined and controlled etched profiles. Also, since less ionizable gas is required, the power consumed for ion production can be significantly reduced, thereby reducing the possibility that undesirable electrical charges will be imparted to the wafer.

Moreover, the improved plasma density and uniformity produces a faster, through controlled, etching rate, increasing semiconductor production capacity.

In a preferred embodiment of the invention, freon 14 gas (CF$_4$) is introduced into an evacuated chamber and subjected to ionizing electrons generated by a discharge between a filament and an anode (such as the chamber wall) within the chamber. This produces a plasma capable of etching a wafer or semiconductor chip within the chamber.

A multidipolar surface magnetic field is formed near the chamber walls so as to produce a boundary confining the generated plasma within the chamber walls, and thereby producing a highly uniform, dense plasma. Preferably, the filament is heated by current from a low voltage DC power supply. The electrons emitted are repelled from the filament by an electrical bias applied to the chamber wall. A low voltage DC power supply is connected to the chamber wall to provide this bias. The electric discharge thus established from the filament ionizes the freon (CF$_4$), thereby creating the plasma.

A substrate to be etched, such as a semiconductor wafer, is carried on a mount within the chamber. The semiconductor substrate and/or mount is preferably provided with a steady negative bias such as by a low power audio oscillator and capacitor combination, which operates independently of the plasma discharge power supplies.

In this embodiment of the invention, the surface magnetic field surrounding the chamber and confining the plasma therein is preferably a multidipolar full-line cusp arrangement of elongate ceramic magnets. The magnets are generally regularly spaced about the chamber walls, with alternating north and south poles facing inwardly toward the chamber center.

For instance, a chamber is constructed using nonmagnetic stainless steel having a vertical cylindrical sidewall and horizontal top and bottom plates sealingly closing the cylinder. A plurality of permanent ceramic magnets are generally regularly spaced and fixed about the outside of the cylinder sidewall, extending substantially parallel to the axis of the cylinder. Additional sets of elongate permanent magnets are further located along the top and bottom plates, again in relative parallel spaced relation to each other, and arranged such that top and bottom magnets extend generally between the ends of opposed permanent magnets located around the vertical cylinder sidewall.

The surface magnetic field formed by this multidipolar configuration is disposed near the wall of the etching chamber. The bulk of the chamber volume, and thus the confined plasma, is substantially free of any magnetic fields.

Using the multidipolar arrangement so described, a very dense uniform plasma can be confined within the etching chamber at relatively low pressure. For instance, a plasma density of $10^{12}$ ions/cm$^3$ can be maintained which is uniform throughout the plasma volume to ±1% or better. This plasma density is believed to be about ten times better than that obtainable with any known commercial plasma etching system.

Improved confinement of the plasma enables the use of much lower operating pressures, on the order of $2 \times 10^{-3}$ to $10^{-5}$ Torr. This is compared to the known etching chambers which are believed to operate at pressures in the range of 2 Torr to $50 \times 10^{-3}$ Torr. Ionizing electrons are also used more efficiently, through better confinement, reducing the power consumption of the ionizing electrical discharge supplies, and providing substantially anisotropic etching for sharper semiconductor profiles. Of course, advantageous results can still be achieved at other operating pressures.

Further, since no radio frequency power supplies are used for the generation of the ionizing electrical discharge or the generation of the magnetic field, the plasma is electrically quiescent. Moreover, little or no electrical bias is induced in the wafer since low voltage DC power supplies are used for ion discharge. The wafer is consequently only biased by the small rectified audio oscillator signal which operates independent of the plasma discharge power supply. This results in easily controlled fine-scale plasma etching.

These and other objectives, features and advantages of the present invention will be more readily understood upon consideration of the following detailed description of the invention taken in conjunction with the accompanying drawings, in which:

DETAILED DESCRIPTION OF THE INVENTION

Figure 1:
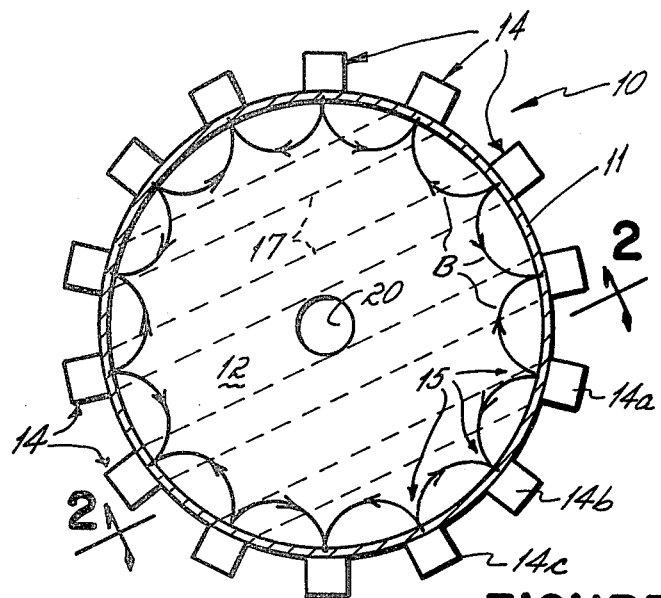
FIG. 1 is an axial cross-sectional view showing the multidipolar magnet arrangement surrounding the chamber side wall, with magnetic field lines represented.

With reference to the Figures, a magnetic multidipolar surface magnetic field boundary is established about an evacuable chamber which is generally indicated at 10. The chamber 10 is a nonmagnetic stainless steel vessel which is substantially cylindrical in form, presenting a cylindrical sidewall 11 having a diameter of 30 cm, a height of 35 cm and a wall thickness of 3 mm. The chamber 10 has a bottom plate 12 which is sealed or is permanently fixed to the bottom of the sidewall 11. A top plate 13 serves as a cover for the chamber 10. The top plate 13 is removable for accessing the interior of the chamber 10, and is made to seal against the top of the sidewall 11 to form the evacuable chamber 10. The top and bottom plates may likewise be made of stainless steel, or other nonmagnetic material such as aluminum plate.

The multidipolar surface magnetic field is generated by a plurality of elongate ceramic magnets 14 which are fixedly mounted to the exterior sidewall 11, as by gluing. The permanent magnets 14 are in parallel relation to each other, and extend from the bottom to the top of the sidewall 11 substantially parallel to the axis of the chamber 10. Ceramic permanent magnets providing a magnetic field (B) of about 1 kG, are used. It may be noted that rare earth permanent magnets can also be used for better field strength, such as samarium-cobolt permanent magnets which develop a field of about 5 kG or more.

Being a dipolar arrangement, the magnets alternate between north and south poles presented to the interior of the chamber 10. That is, magnet 14$a$ presents a north pole along its length immediately adjacent the wall 11, magnet 14$b$ a south pole, magnet 14$c$ a north pole, and so on around the cylindrical sidewall 11.

A schematic representation of the magnetic field around the cylinder sidewall 11 is represented by the arcuate arrows generally indicated at B. The surface magnetic field created by this mutidipolar configuration is confined to the region immediately adjacent the sidewall 11. That is, the portion of the magnetic field directed within the chamber is strongest just inside the chamber sidewall 11, and drops to nearly zero field strength between 5 to 8 centimeters progressing interiorly from the wall with the above described 1 kG magnets spaced a distance of 7 cm apart edge to edge. The bulk of the chamber volume is thus substantially field free. It should be noted that the use of more magnets will draw the magnetic field B closer to the sidewall 11, while fewer magnets will extend that boundary further into the chamber interior. A certain optimization between the surface magnetic field produced and the desired field free interior volume can thus be obtained through the predetermined number of magnets employed as well as their respective field strengths.

The surface magnetic field produced by this multidipolar permanent magnet arrangement has a plurality of cusps, generally indicated at 15, which correspond with the respective axes of the elongate magnets 14. Formation of full line cusps optimizes the magnetic multipole confinement of the plasma. Virtually no magnetic field is present along these cusp lines, with the consequence that a small amount of leakage of primary electrons and ions can occur along the cusps. This loss is relatively insignificant for purposes of plasma etching, however. In this regard, it will be recognized that although permanent magnets are utilized in the description of this embodiment for formation of the multidipolar surface magnetic field, other techniques may be utilized in the formation of a surface magnetic field having the characteristic magnetic line cusps, such as a line or sheet current carrying pattern.

The surface magnetic field is completed around the chamber using similar elongate permanent magnets which are likewise arranged in parallel spaced relation along the top and bottom plates 12 and 13. The top and bottom magnets 16 and 17, respectively, generally extend across a chordal length of the respective plate and generally between the ends of the side wall magnets 14 adjacent either end of that chord. (dotted lines, FIG. 1). In this way, a "band-like" arrangement is formed of chamber girdling magnets.

Like the sidewall magnets 14, a multidipolar surface magnetic boundary is established by the upper and lower magnets 16, 17. It will be noted that where the upper and lower plates 12, 13 are thick, slots are milled therein to receive the magnets 16, 17 to allow the poles to be within 0.24 cm of the chamber interior. It will also be noted that maintenance of exact spacing between the magnets is not extremely critical herein; a greater spacing between magnets on either side of a wide port in the chamber 10 can thus be accommodated.

The chamber 10 is made to be evacuated down to a pressure of about $10^{-6}$ Torr through the use of a vacuum pump (not shown) which communicates with the interior of the chamber 10 through port 20 in the bottom plate 12.

Figure 2:
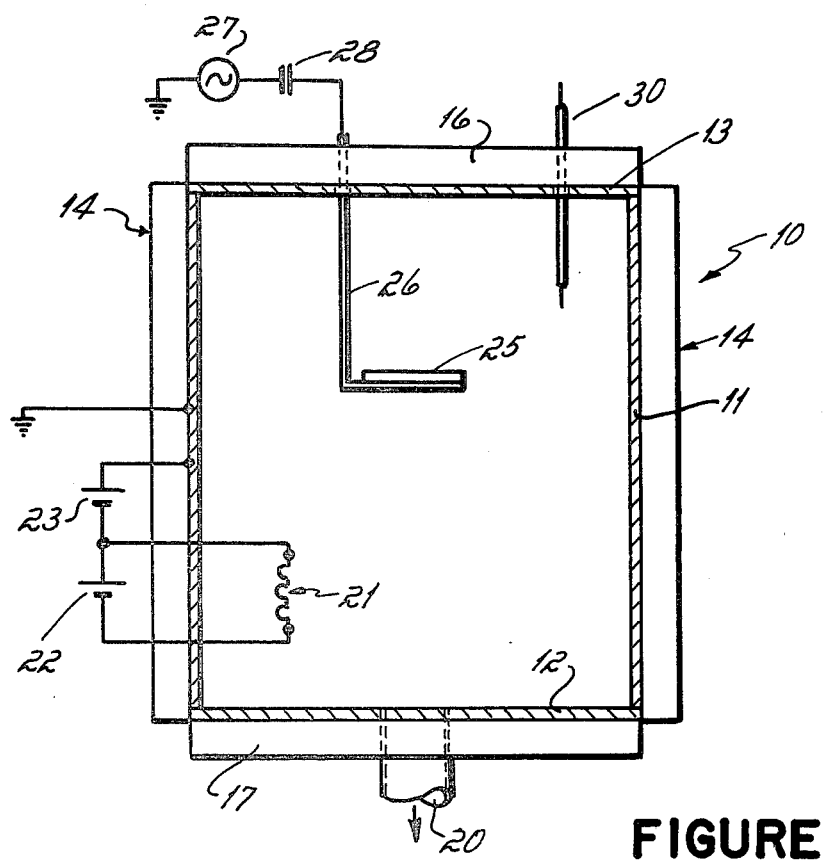
FIG. 2 is a vertical cross-sectional view taken along line 2—2 of FIG. 1.

With particular reference to FIG. 2, one or more filament electrodes 21 are located within the chamber 10. The filament 21 is connected to a low voltage DC power supply 22 located externally to the chamber 10. The DC power supply provides a current through the filament electrode causing the filament to emit electrons. Obviously, other means can be used to generate electrons herein, such as a tantalum hollow-cathode tube, ion cyclotron resonance, etc.

An electrical discharge is established from the heated filament 21 by repelling the ionizing electrons from the filament 21 toward an opposed anode, such as, preferably, the grounded metal chamber wall. The discharge is established by a voltage in the range of 50-150 volts from a DC power supply 23 which is connected to the wall 11, with a discharge current preferably in the range of 0.1-5A. The electrical discharge thus established is used to ionize a gas which is admitted to the chamber 10 to produce a plasma. Freon 14 ($CF_4$) has been advantageously used as the gas herein.

Due to the nature of the multidipolar surface magnetic field used to confine the plasma generated, very low generating pressures can be used, on the order of $2 \times 10^{-3}$ Torr to $10^{-5}$ Torr. Such low pressures are at least a factor of 10 lower than those used in known commericial plasma etching devices. This is due in large part to the fact that the multidipolar surface magnetic field improves the efficiency of ionization within the chamber through better confinement of the ionizing electrons. The use of lower gas pressures enables much more anisotropic etching to take place, resulting in narrower and sharper semi-conductor profiles.

More efficient ionization also enables the density of the plasma to be increased. Plasma densities on the order of $10^{12}$ ions/cm$^3$ have been achieved with this invention, which represents an increase by a factor of 10 over plasma densities of known etching devices. The multidipolar surface magnetic field further yields a plasma where both ionizing electrons and plasma electrons and ions are substantially uniformly distributed throughout the plasma volume, with a deviation in density throughout the volume of ±1% or less.

The substrate to be etched, such as a conventional semiconductor wafer 25 made of polycrystalline silicon material, is supported within the chamber 10 by a substrate mount 26, which is preferably water cooled. A portion of the substrate mount extends through the top plate 13 and is connected to a biasing voltage source which can advantageously be operated independent of the discharge power supplies. A low power audio oscillator 27 has been effectively used to produce the wafer biasing signal. The low power signal generated by the oscillator 27 rectified by capacitor 28 establishes a steady negative voltage bias at the wafer 25 relative to the plasma. For example, a signal of 0 to 300 peak volts at 5 kHz is generated by the oscillator 27, providing a steady DC voltage bias of zero to −300 volts at the wafer 25. Biasing the wafer in this manner improves the etching speed and etching directionality, and results in easily controlled fine-scale plasma etching. An arrangement can also be made in which the wafer 25 itself can be biased without the need of going through the mount 26.

It will be noted that no radio-frequency power sources are used for either the discharge current or the generation of the multidipolar surface magnetic field confining the plasma. As a result, there is virtually no perturbing radio-frequency interference with the etching process, thus permitting the controlled plasma etching obtainable herein.

In operation, a wafer 25 to be etched is placed on the mount 26 and secured within the chamber 10. The chamber is then evacuated to about $10^{-6}$ Torr, and ionizable gas such as $CF_4$ is admitted to the chamber up to a pressure of about $2 \times 10^{-3}$ Torr or less.

An electrical discharge is generated between the heated filament 21 and the sidewall 11 serving as the anode, such that a glow discharge is maintained, ionizing the gas and producing a plasma. The wafer, which has been previously treated with a photoresist mask, is then etched perpendicular to the wafer surface by the plasma. An etching rate of 1,000-2,500 Angstroms/minute has been achieved with this apparatus and method.

General parameters for the plasma within the chamber 10 can be monitored, as by the use of a Langmuir probe 30 inserted through a sealable port in the top plate 13.

It will thus be seen that the application of a multidipolar surface magnetic field to confine the etching plasma greatly increases the effectiveness and efficiency of plasma etching through the production of a dense, relatively uniform and quiescent plasma which is maintainable at relatively low gas pressures. Controlled fine-scale anisotropic etching is also achieved through the use of DC power sources which do not generate radio-frequency interference, enabling controlled biasing of the wafer relative to the plasma unaffected by the discharge power supplies.

While the invention has been described in connection with a certain embodiment, it will be immediately obvious to those skilled in the art that many modifications of structure, arrangement, portions, elements, materials and components can be used in the practice of the invention without departing from the scope of the invention, and applicant intends to be bound only by the claims appended hereto.

What is claimed is:

1. An apparatus for plasma etching of a substrate, comprising:
   a chamber,
   a gas within the chamber,
   means for ionizing the gas within the chamber to create a plasma,
   substrate mounting means for holding the substrate in the plasma,
   a power supply for electrically biasing the substrate relative to the plasma, and
   means for producing a surface magnetic field confining the plasma within the chamber.

2. The apparatus of claim 1 wherein the means for producing the surface magnetic field is a plurality of permanent magnets surrounding the chamber, which magnets are disposed to establish a multidipolar magnetic field adjacent the chamber walls.

3. The apparatus of claim 2 wherein the chamber is generally cylindrical, having a cylindrical sidewall, a top plate and a bottom plate, and wherein each of the plurality of permanent magnets are elongated and are generally regularly spaced around the cylinder sidewall, each extending substantially along the axis of the cylinder, other elongate permanent magnets being further located along the top and bottom plates in parallel spaced relation and generally extending to the ends of the permanent magnets located around the cylinder sidewalls.

4. The apparatus of claim 2 wherein the chamber has a sidewall in the form of a cylinder, and a top wall and a bottom wall sealing the ends of the cylinder such that the chamber thus formed is capable of maintaining reduced pressure therein, and wherein the plurality of permanent magnets are elongated and generally regularly spaced around the sidewall, extending substantially along the axis of the cylinder, other magnets being further located along the top and bottom walls in generally parallel spaced relation thereon, said top and bottom wall magnets each generally extending normal to and coplanar with two opposed magnets located around the cylinder sidewall.

5. The apparatus of claim 4 wherein the gas pressure within the chamber is maintained at a pressure of about $2 \times 10^{-3}$ Torr or less.

6. The apparatus of claim 5 wherein the means for ionizing the gas comprises a resistive filament located within the chamber and a source of direct current for heating the filament to cause the emission of electrons from the filament, and a source of direct current biasing the chamber wall, whereby electrons emitted by the filament are repelled from the filament thereby producing a discharge ionizing the gas within the chamber.

7. The apparatus of claim 6 wherein the power supply for biasing the substrate is controllable and operates independent of the filament and discharge power supplies.

8. The apparatus of claim 5 wherein the density of the plasma is maintained at about $10^{12}$ charged particles per cubic centimeter, and said density is uniform throughout the chamber to within $\pm 1\%$.

9. The apparatus of claim 6 wherein the substrate is steadily biased by a rectified signal from an audio-oscillator, which signal is not affected by filament and anode power supplies.

10. The apparatus of claim 1 wherein the means for producing the surface magnetic field is a multidipolar arrangement forming generally regularly spaced magnetic field line cusps around the chamber extending substantially parallel to the axis of the chamber.

11. The apparatus of claim 3 wherein the plurality of magnets are elongated ceramic magnets, each elongate magnet producing a magnetic field of about 1 kG, the magnets being fixed about the exterior of the chamber sidewall and the exterior of the top and bottom walls, adjacent parallel magnets presenting opposite poles to the center of the chamber, the surface magnetic field thereby produced being generally disposed adjacent the chamber walls.

12. The apparatus of claim 11 wherein the surface magnetic field is substantially zero about 10 centimeters from the interior of the chamber walls.

13. An apparatus for anisotropic plasma etching of a solid substrate, comprising:
   a chamber, said chamber being capable of maintaining a low pressure therein,
   substrate mounting means for holding the substrate in the plasma,
   means for electrically biasing the substrate relative to the plasma, and
   means for producing a multipolar surface magnetic field for confining the plasma in the chamber, whereby the plasma is of substantially uniform density throughout its volume.

14. The apparatus of claim 13 wherein said multipolar surface magnetic field is a multidipolar surface magnetic field.

15. The apparatus of claim 13 wherein the multipolar surface magnetic field has a plurality of line cusps generally regularly spaced about the interior of the chamber and extending substantially parallel to the axis of the chamber.

16. The apparatus of claim 15 wherein the cusps are full line cusps.

17. The apparatus of claim 14 wherein the chamber has a top, bottom and sides, and the means for producing the multidipolar surface magnetic field is a plurality of elongate permanent magnets which are generally regularly spaced in parallel relation about the chamber sides, and along the top and bottom in spaced parallel relation thereon.

18. The apparatus of claim 14 wherein the pressure within the chamber for etching is about $2 \times 10^{-3}$ Torr or less, and the density of the plasma is about $10^{12}$ charged particles per cubic centimeter.

19. The apparatus of claim 18 wherein the means for producing a plasma includes a filament which emits electrons when heated, a DC power supply for heating the filament, and means for repelling the electrons from the filament to create an electric discharge ionizing the gas, a DC power supply for the repelling means, and wherein the means for biasing the substrate is independent of said DC power supplies and provides a controllable bias to the substrate.

20. An apparatus for anisotropic etching of a substrate, comprising:
   a low pressure chamber having sides, a top and a bottom,
   means for producing a plasma within the chamber,
   substrate mounting means for holding the substrate in the plasma,
   controllable means for electrically biasing the substrate relative to the plasma, and
   means for producing a multidipolar surface magnetic field substantially confining the plasma within the chamber as a dense plasma having about $10^{12}$ or more charged particles per cubic centimeter, which density is substantially uniform throughout the volume of said plasma to about $\pm 1\%$.

21. The apparatus of claim 20 wherein the chamber has a sidewall in the form of a cylinder, and a top wall and a bottom wall sealed to the ends of the cylinder such that the chamber thus formed is capable of maintaining reduced pressure therein, and wherein the plurality of permanent magnets are elongated and generally regularly spaced around the sidewalls extending substantially along the axis of the cylinder, permanent magnets being further located along the top and bottom walls in generally parallel spaced relation thereon, said top and bottom wall magnets generally extending between the respective top and bottom ends of the permanent magnets located around the cylinder sidewall.

22. The apparatus of claim 21 wherein the means for producing a plasma includes a filament which emits electrons when heated, a DC power supply for heating the filament, an anode for repelling and accelerating the electrons so emitted, and a DC power supply for the anode.

23. An apparatus for plasma etching of a substrate comprising:
   chamber,
   a cathode and cathode power supply for producing ionizing electrons,
   an anode and an anode power supply for creating an electrical discharge from the heater element and within the chamber,
   a gas within the chamber which is ionized by the discharge thereby creating a plasma,
   substrate mounting means for holding the substrate in the plasma,
   a controlled power supply communicating with the substrate for electrically biasing the substrate relative to the plasma, and
   means for producing a multidipolar surface magnetic field confining the plasma within the chamber.

24. The apparatus of claim 23 wherein the chamber has a top, bottom and sides, and the means for producing the multidipolar surface magnetic field is a plurality of elongate permanent magnets which are generally regularly spaced about the chamber sides in parallel relation, and along the top and bottom in spaced parallel relation thereon, and wherein only low voltage DC power supplies are used for the anode and cathode power supplies.

25. An improved apparatus for plasma etching of a substrate which is carried on a mount within a chamber, wherein an ionizing current is established between a cathode and an anode to thereby ionize a gas confined within the chamber to create a plasma, the substrate being further electrically biasable relative to the plasma, wherein the improvement comprises:
   a multidipolar surface magnetic field confining the plasma within the chamber, the surface magnetic field comprising a magnetic boundary to the plasma adjacent the inside chamber wall, whereby a substantially uniform plasma is established within the chamber for etching the substrate therein.

26. The apparatus of claim 25 wherein the surface magnetic field confines the plasma into a dense plasma having about $10^{12}$ or more charted particles per cubic centimeter, which density is substantially uniform throughout the volume of said plasma, and wherein said plasma is maintained at a pressure of about $10^{-3}$ Torr or less, and wherein said ionizing current is produced and maintained by DC voltage supplied to the anode and cathode.

27. The method of plasma etching of a semi-conductor substrate comprising the steps of:
   placing a masked semiconductor substrate in a chamber,
   admitting a gas into said chamber at low pressure,
   producing a multipole surface magnetic field boundary within said chamber,
   producing an ionizing discharge within said boundary and thereby ionizing said gas to produce a plasma,
   confining said plasma within said magnetic boundary to provide a uniform plasma environment around said semiconductor substrate, and
   etching said semiconductor substrate.

28. The method of claim 27 further including the step of electrically biasing the semiconductor substrate relative to the plasma.

29. The method of claim 27 wherein the multipole magnetic boundary is a multidipolar surface magnetic field formed by a plurality of permanent magnets regularly spaced about the chamber presenting alternating poles to the chamber interior.

30. A method of etching materials by plasma treatment comprising the steps of:
   introducing a gas into a space defined and surrounded by a surface magnetic field;
   generating ionizing electrons within said space;
   ionizing said gas with said electrons to produce an etching plasma within said space; and
   subjecting a material to be etched to said etching plasma within said space in order to etch said material.

31. The method of claim 30 further including the step of electrically biasing the material to be etched relative to the plasma with a controllable and independent power supply.

32. The method of claim 31 wherein the surface magnetic field is a multidipolar surface magnetic field.

33. An apparatus for etching materials by plasma treatment comprising:
   means for producing a surface magnetic field,
   means for introducing a gas into a space defined and surrounded by said surface magnetic field,
   means for creating an electrical discharge within said space ionizing gas within said space to create a plasma, and
   means for holding material to be etched within the plasma.

34. The apparatus of claim 33 further including a controllable power supply for electrically biasing the material to be etched relative to the plasma for substantially anisotropic etching.

35. The apparatus of claim 34 wherein the means for producing said surface magnetic field is a plurality of permanent magnets disposed in a multidipolar arrangement to confine the plasma into a dense plasma having about $10^{12}$ or more charged particles per cubic centimeter, which density is substantially uniform throughout the volume of the plasma, and wherein the plasma is maintained at a pressure of about $2 \times 10^{-3}$ Torr or less for etching.

* * * * *

UNITED STATES PATENT AND TRADEMARK OFFICE
CERTIFICATE OF CORRECTION

PATENT NO.   :   4,483,737
DATED        :   November 20, 1984
INVENTOR(S)  :   Thomas D. Mantei It is certified that error appears in the above-identified patent and that said Letters Patent is hereby corrected as shown below:

Column 9, line 52, before "chamber" insert --a--.

Column 10, line 23, "charted" should be --charged--.

Signed and Sealed this

Seventh Day of May 1985

[SEAL]

Attest:

DONALD J. QUIGG

Attesting Officer        Acting Commissioner of Patents and Trademarks

REEXAMINATION CERTIFICATE (1518th)

United States Patent [19]
Mantei

[11] B1 4,483,737
[45] Certificate Issued Jul. 30, 1991

[54] METHOD AND APPARATUS FOR PLASMA ETCHING A SUBSTRATE

[75] Inventor: Thomas D. Mantei, Cincinnati, Ohio

[73] Assignee: Sematech, Inc.

Reexamination Request:
No. 90/002,137, Sep. 14, 1990

Reexamination Certificate for:
Patent No.: 4,483,737
Issued: Nov. 20, 1984
Appl. No.: 462,200
Filed: Jan. 31, 1983

Certificate of Correction issued May 7, 1985.

[51] Int. Cl.$^5$ ............. H01L 21/306; B44C 1/22; C03C 15/00; C03C 25/06
[52] U.S. Cl. ............. 156/643; 156/345; 156/646; 204/192.32; 204/298.34; 204/298.37
[58] Field of Search ............. 156/345, 626, 627, 643, 156/646, 662; 118/728, 50.1, 620, 623; 427/38, 39; 204/192.32, 192.35, 192.37, 298.31, 298.37, 164, 298.34

[56] References Cited

U.S. PATENT DOCUMENTS

| | | | |
|---|---|---|---|
| 3,878,085 | 4/1975 | Corbani | 204/298 |
| 4,073,669 | 2/1978 | Heinecke | 156/643 |
| 4,116,806 | 9/1978 | Love et al. | 204/298 |
| 4,123,316 | 10/1978 | Tsuchimoto | 156/643 |
| 4,158,589 | 6/1979 | Keller et al. | 156/345 |
| 4,180,450 | 12/1979 | Morrison | 204/298 |
| 4,192,706 | 3/1980 | Horiike | 156/643 |
| 4,194,962 | 3/1980 | Chambers et al. | 204/298 |
| 4,219,397 | 8/1980 | Clarke | 204/298 |
| 4,222,838 | 9/1980 | Bhagat et al. | 204/298 |
| 4,233,537 | 11/1980 | Limpaecher | 313/231.3 |
| 4,243,506 | 1/1981 | Ikeda et al. | 204/298 |
| 4,252,595 | 2/1981 | Yamamoto et al. | 156/345 |
| 4,253,907 | 3/1981 | Parry et al. | 156/643 |
| 4,277,304 | 7/1981 | Horiike et al. | 156/643 |
| 4,298,419 | 11/1981 | Suzuki et al. | 156/345 |
| 4,307,283 | 12/1981 | Zajac | 219/121 |
| 4,312,731 | 1/1982 | Morrison | 204/298 |
| 4,361,472 | 11/1982 | Morrison | 204/192 E |

FOREIGN PATENT DOCUMENTS

| | | |
|---|---|---|
| 56-63799 | 5/1981 | Japan . |
| 57-185653 | 11/1982 | Japan . |
| 57-203781 | 12/1982 | Japan . |

OTHER PUBLICATIONS

Physics Letters, vol. 51A, No. 8, May 5, 1975, pp. 490-492, K. N. Leung, T. K. Samec & A. Lamm, Optimization of Permanent Magnet Plasma Confinement.
J. Vacuum Science Technology, 21(3), Sep./Oct. 1982, pp. 725 and 727, H. R. Kaufman, Technology and Applications of Broad-Beam Sources Used in Sputtering.
IBM Technical Disclosure Bulletin, vol. 21, No. 12, May 1979, pp. 5006-5007, B. N. Chapman, Triode Systems for Plasma Etching.
Applied Physics Letters, No. 34, Feb. 1979, pp. 192-193, V. J. Minkiewicz & B. N. Chapman, Triode Plasma Etching.
Applied Physics Letters No. 37, Oct. 1980, pp. 646-648, B. Drevillion, J. Huc, A. Lloret, J. Perrin, G. deRosny, & J. P. M. Schmitt, Silane Dissociation Mechanisms and Thin Film Formation in a Low Pressure Multipole DC Discharge.
Revue de Physique Appliquee, vol. 12(8), Aug. 1977, pp. 1143-1148, A. Truc, et al., "Parodie, Plasma Stationnaire Homogene De Grande Dimension".
Phys. Fluids, vol. 22(6), Jun. 1979, pp. 1171-1181, Coakley, et al., "Laboratory Double Layers".
Phys. Fluids, vol. 23(6), Jun. 1980, pp. 1155-1163, Ze, et al., "Oblique Collision of Ion-acoustic Solitons".
Physical Review Letters, vol. 45(20), Nov. 17, 1980, pp. 1626-1629, Nishida, et al., "Oblique Collision of Plane Ion-Acoustic Solitons".
Rev. Sci. Instrum., vol. 44(6), Jun. 1973, pp. 726-731, Limpaecher, et al., "Magnetic Multipole Containment of Large Uniform Collisionless Quiescent Plasmas".
Phys. Fluids, vol. 22(8), Aug. 1979, pp. 1554-1557, Ze, et al., "Excitation of Spherical Ion-acoustic Solitons with a Conducting Probe".

*Primary Examiner*—William A. Powell

[57] ABSTRACT

A method and apparatus for plasma etching a substrate, such as a semiconductor wafer, utilizing a multipole surface magnetic field confining within an etching chamber an etching plasma of substantially uniform density throughout its volume. The plasma is produced and maintained by subjecting a gas such as $CF_4$ to an ionizing discharge within the chamber. Only DC power sources are used for the discharge, so that there is virtually no perturbing radio frequency interference produced. The wafer is consequently easily biased relative to the plasma for controlled fine-scale etching. Low gas pressures permitted by the surface magnetic field result in substantially anisotropic etching of the substrate by dense plasma concentrations.

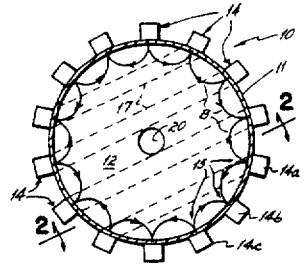

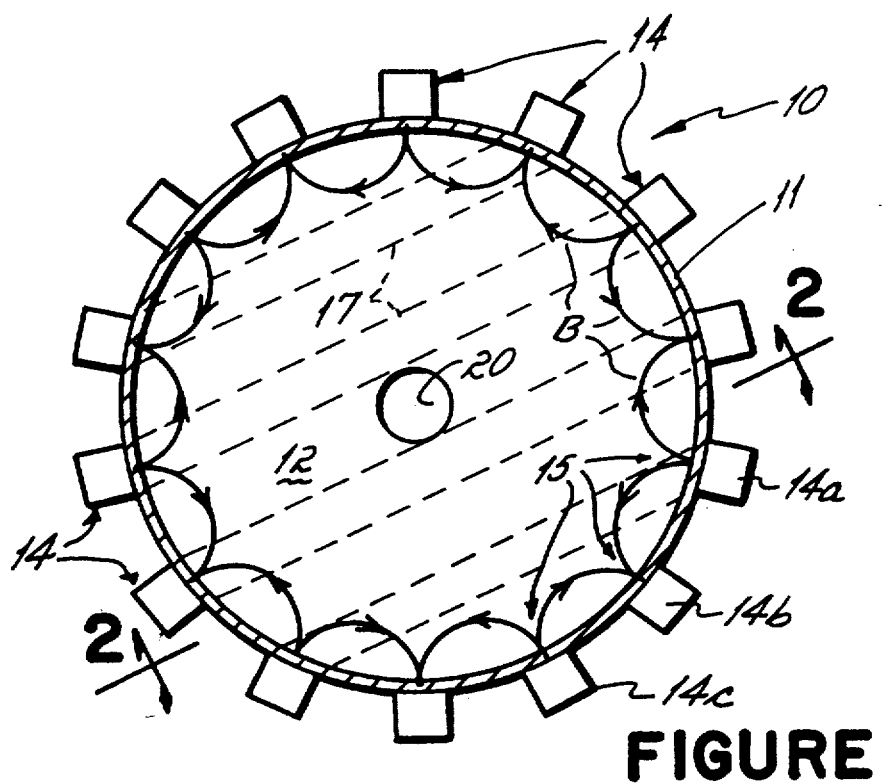
FIGURE

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–22 and 25–35 is confirmed.

Claim 23 is determined to be patentable as amended.

Claim 24, dependent on an amended claim, is determined to be patentable.

23. An apparatus for plasma etching of a substrate comprising:
 *a* chamber,
 *a heater element within the chamber,*
 a cathode and cathode power supply for producing ionizing electrons,
 an anode and an anode power supply for creating an electrical discharge from the heater element and within the chamber,
 a gas within the chamber which is ionized by the discharge thereby creating a plasma,
 substrate mounting means for holding the substrate in the plasma,
 a controlled power supply communicating with the substrate for electrically biasing the substrate relative to the plasma, and
 means for producing a multidipolar surface magnetic field confining the plasma within the chamber.

* * * * *